(12) United States Patent
Satake et al.

(10) Patent No.: US 9,041,023 B2
(45) Date of Patent: May 26, 2015

(54) LIGHT EMITTING DEVICE

(71) Applicant: NICHIA CORPORATION, Kaminaka-cho, Anan-shi, Tokushima (JP)

(72) Inventors: Yuji Satake, Itano-gun (JP); Tomoyuki Sato, Itano-gun (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/044,575

(22) Filed: Oct. 2, 2013

(65) Prior Publication Data

US 2014/0091335 A1   Apr. 3, 2014

(30) Foreign Application Priority Data

Oct. 3, 2012 (JP) ................. 2012-220909
Sep. 27, 2013 (JP) ................. 2013-201790

(51) Int. Cl.
| | |
|---|---|
| H01L 33/00 | (2010.01) |
| F21S 4/00 | (2006.01) |
| H01L 33/48 | (2010.01) |
| F21V 17/10 | (2006.01) |
| F21V 19/00 | (2006.01) |
| F21Y 103/00 | (2006.01) |

(52) U.S. Cl.
CPC .............. F21S 4/005 (2013.01); H01L 33/48 (2013.01); F21S 4/006 (2013.01); F21V 17/10 (2013.01); F21V 19/003 (2013.01); *F21Y 2103/003* (2013.01)

(58) Field of Classification Search
CPC ...................................... H01L 33/48
USPC ............................. 257/88; 362/217, 218, 235
See application file for complete search history.

(56) References Cited

U.S. PATENT DOCUMENTS

| | | | |
|---|---|---|---|
| 2012/0069556 A1 | 3/2012 | Bertram et al. | |
| 2012/0099302 A1* | 4/2012 | Kim | ............... 362/218 |
| 2014/0254145 A1* | 9/2014 | Lee et al. | ............ 362/218 |

FOREIGN PATENT DOCUMENTS

| | | |
|---|---|---|
| DE | 10 2009 023 052 A1 | 12/2010 |
| JP | 2002-289004 | 10/2002 |
| JP | 2005-208412 | 8/2005 |
| WO | WO-2004/031648 A2 | 4/2004 |
| WO | WO-2011/006725 A1 | 1/2011 |

OTHER PUBLICATIONS

Communication—Search Report in EP Appl. No. 13187099.0 dated Mar. 5, 2014.

* cited by examiner

*Primary Examiner* — Phuc Dang
(74) *Attorney, Agent, or Firm* — Foley & Lardner LLP (57) ABSTRACT

To provide a light emitting device that can maintain a desired light emission even when the tube is bent. The light emitting device of the present invention includes: a bendable tube extending in a first direction; a flexible board extending in the first direction and housed in the tube; and a plurality of light emitting elements mounted on the flexible board, wherein the flexible board comprises a plurality of protrusions aligned in the first direction on both sides in a second direction perpendicular to the first direction, on which the light emitting elements are mounted, and the plurality of protrusions are in contact with an inner wall of the tube such that the inner wall clamps the flexible board in a bent position.

10 Claims, 8 Drawing Sheets

LIGHT EMITTING DEVICE

BACKGROUND OF THE INVENTION

1. Field of the Invention

The present invention relates to a bendable light emitting device using a flexible board.

2. Description of Related Art

In recent years, proposals have been made to provide bendable light emitting devices using a flexible board (see paragraphs 0006, 0063, etc. of JP 2002-289004 A). Such bendable light emitting devices can be used for illumination and neon signs.

The light emitting device disclosed in JP 2002-289004 A includes a plurality of LED units 3 that are connected to lead wires (7A and 7B) and are inserted in a silicone rubber tube. However, because the LED units 3 are easily displaced with respect to the inner wall of the tube, the light emitting faces of the LED units 3 point different directions when the light emitting device is bent. As a result, it has been difficult to maintain desired light emission.

SUMMARY OF THE INVENTION

The present invention has been made in order to solve the above-mentioned problem, and an object thereof is to provide a light emitting device that can maintain desired light emission even when its tube is bent.

A light emitting device according to an embodiment includes: a bendable tube that is longer (or that extends) in a first direction; a flexible board that is longer (or that extends) in the first direction and is housed in the tube; and a plurality of light emitting elements mounted on the flexible board, wherein the flexible board includes a plurality of protrusions aligned in the first direction on both sides of a second direction perpendicular to the first direction, on which the plurality of light emitting elements are mounted, and wherein the plurality of protrusions are in contact with an inner wall of the tube such that the inner wall clamps the flexible board in a bent position.

With the present invention, it is possible to provide a light emitting device that can maintain desired light emission even when its tube is bent.

DETAILED DESCRIPTION OF EMBODIMENTS

A light emitting device 100 according to an embodiment of the present invention will be described below with reference to the accompanying drawings. The configurations mentioned below are merely examples that embody the technical idea of the present invention, and the present invention is not intended to be limited thereto. Further, the position, size and the like of the components illustrated in the drawings may include some exaggeration for descriptive reasons. The same or analogous components are basically denoted by the same names or reference signs, and the descriptions thereof may be omitted.

Figure 1:
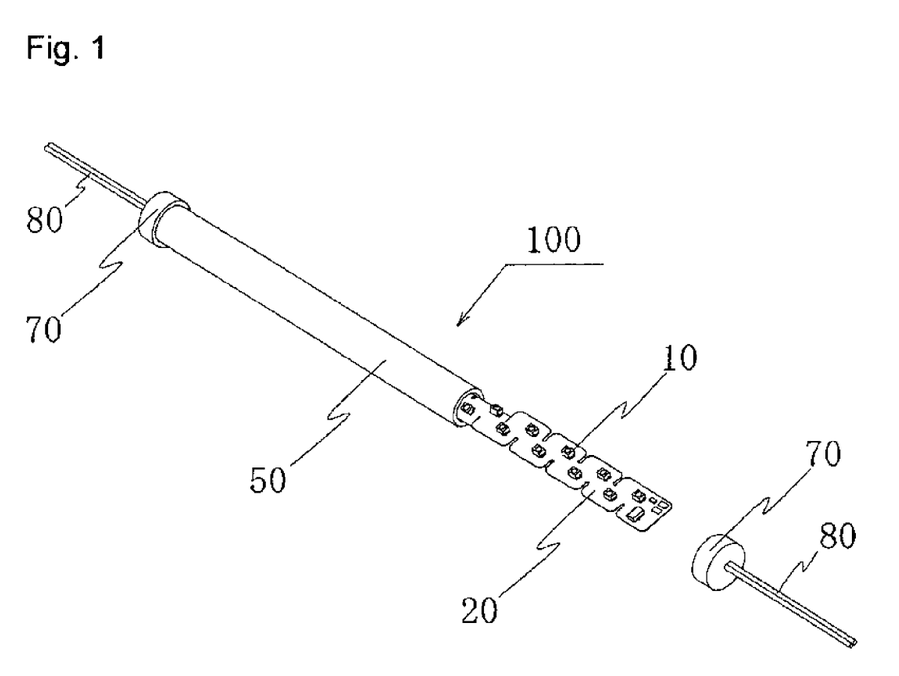
FIG. 1 is an exploded perspective view of a light emitting device according to an embodiment of the present invention.
Figure 2:
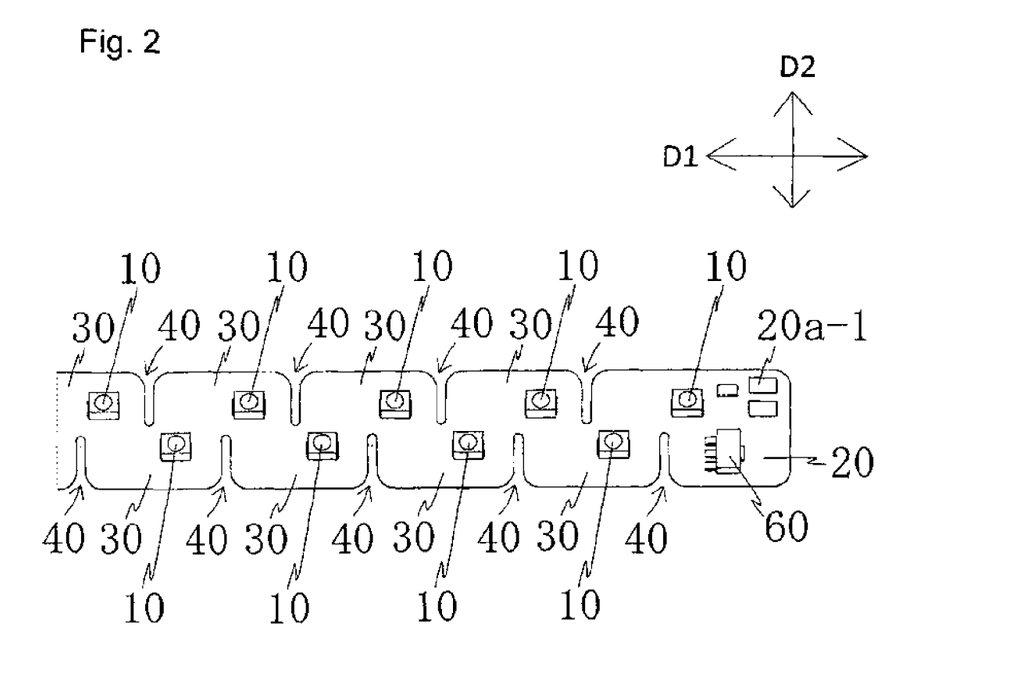
FIG. 2 is an enlarged view illustrating the tip part of a flexible board of FIG. 1.
Figure 3:
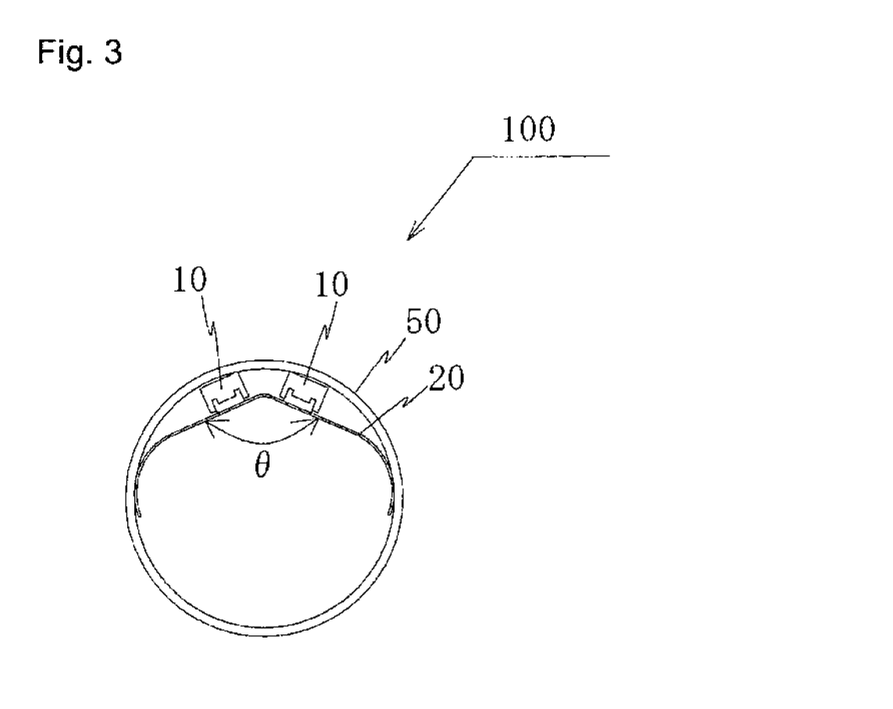
FIG. 3 is a cross sectional view of the light emitting device according to the embodiment of the present invention along the transverse direction.
Figure 4:
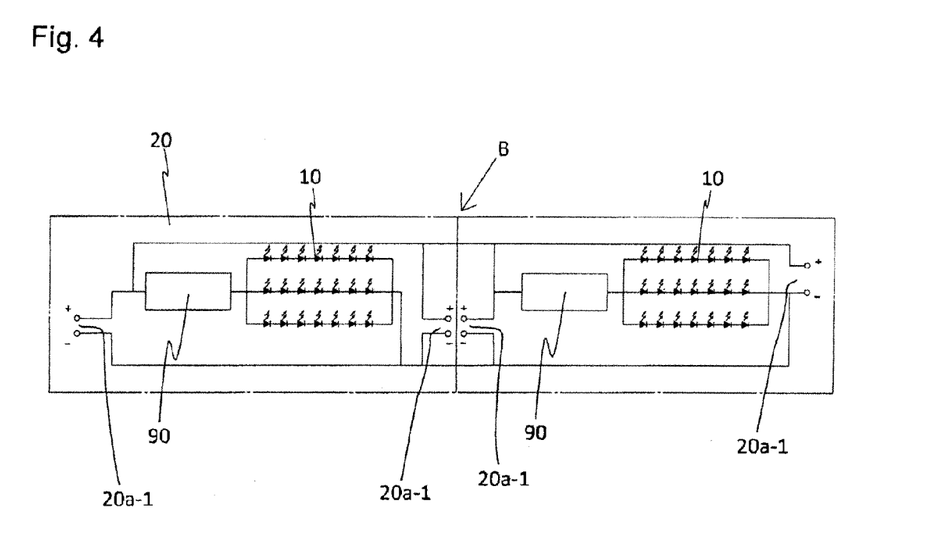
FIG. 4 is a circuit diagram of the light emitting device according to the embodiment of the present invention.

FIG. 1 is an exploded perspective view of the light emitting device 100. FIG. 2 is an enlarged plan view illustrating the tip part of a flexible board of FIG. 1, and FIG. 3 is a cross sectional view of the light emitting device 100 along the transverse direction (or shorter direction). FIG. 4 is a circuit diagram of the light emitting device 100.

In order to provide a better understanding of the arrangement of the light emitting elements 10, FIG. 3, in a sectional view, illustrates two light emitting elements 10 that are not on the same cross section in reality.

As illustrated in these figures, the light emitting 100 includes: a bendable tube 50 that is longer (extends) in a first direction D1 (longitudinal direction, the inner wall extends along the first direction D1); a flexible board 20 that is longer (extends) in the first direction D1 and is housed in the tube 50; and a plurality of light emitting elements 10 mounted on the flexible board 20. The flexible board 20 includes a plurality of protrusions 30 (the "protrusion 30" may be referred to a "wing portion 30") aligned in the first direction on both sides in a second direction D2 (transverse direction) perpendicular to the first direction (on both ends in the transverse direction), on which the light emitting elements 10 are mounted. The protrusions 30 are clamped by the inner wall of the tube 50 such that the flexible board 20 is bent.

As used herein, the first direction D1 represents two directions denoted by the arrows in FIGS. 2, 6, 7A and 8 (right and left directions in FIGS. 2, 6, 7A and 8), and the second direction D2 represents two directions denoted by the arrows in FIGS. 2, 6, 7A and 8 (up and down directions in FIGS. 2, 6, 7A and 8).

In the light emitting device 100, the flexible board 20 is clamped by the inner wall of the tube 50, (i.e. the protrusions 30 are in contact with the inner wall of the tube 50 such that the flexible board 20 is clamped by the inner wall of the tube 50). This can prevent the light emitting elements 10 from their light emitting faces pointing unintended directions when the tube 50 is bent, and a desired light emission can be thus maintained. Further, the flexible board 20 itself is bent in the second direction (in more detail, as illustrated in FIG. 3, the flexible board 20 is bent such that the end-to-end distance in the second direction D2 gets narrower and the flexible board 20 gets close to the inner wall of the tube 50 to form a bulge in the direction approximately perpendicular to both of the first direction D1 and the second direction D2), and the light emitting elements 10 are placed on both sides in the second direction D2. This enables the wide light distribution. In the flexible board 20, each side in the second direction D2 is provided with a plurality of the protrusions 30 (i.e. on each side of the second direction D2 of the flexible board 20, two protrusions adjacent in the first direction D1 are separated from each other). As a result, the flexible board 20 does not interfere with bending deformation of the tube 50 even though it is housed in the tube 50 in the bent position.

Furthermore, the light emitting elements 10 are prevented from coming off from the flexible board 20 when the tube 50 is bent. That is, referring to FIG. 3, when the tube 50 is bent such that the both ends thereof, which are located in front of and behind the paper, are displaced leftward or rightward (i.e. the tube 50 extending in the first direction D1 is bent such that the both ends thereof in the first direction D1 get close to each other), the tube 50 presses the light emitting elements 10 in the most curved area of the light emitting device 100 (in the center area of the tube 50 in the first direction D1). Then, if the pressure of the tube 50 exceeds the allowable limit of the light emitting elements 10, the light emitting elements 10 may come off from the flexible board 20. However, in the light emitting device 100 of the present invention, because the light emitting elements 10 are mounted on the protrusions 30, the protrusions 30 can be deformed to relieve the force acting on the light emitting elements 10, even if the tube 50 presses the light emitting elements 10 when the light emitting device 100 is bent. This can prevent the light emitting elements 10 from coming off from the flexible board 20.

Major components and the like of the light emitting device 100 will be described below.

(Light Emitting Element 10)

Typically, LEDs (light emitting diodes) may be used as the light emitting elements 10. LEDs may be semiconductor chips themselves or packages of semiconductor chips with housings. The present embodiment employs surface-mount LEDs with packaged semiconductor chips as the light emitting elements 10. The color of the light emitting elements 10 may be suitably selected from white, blue and the like according to applications.

(Flexible Board 20)

Figure 6:
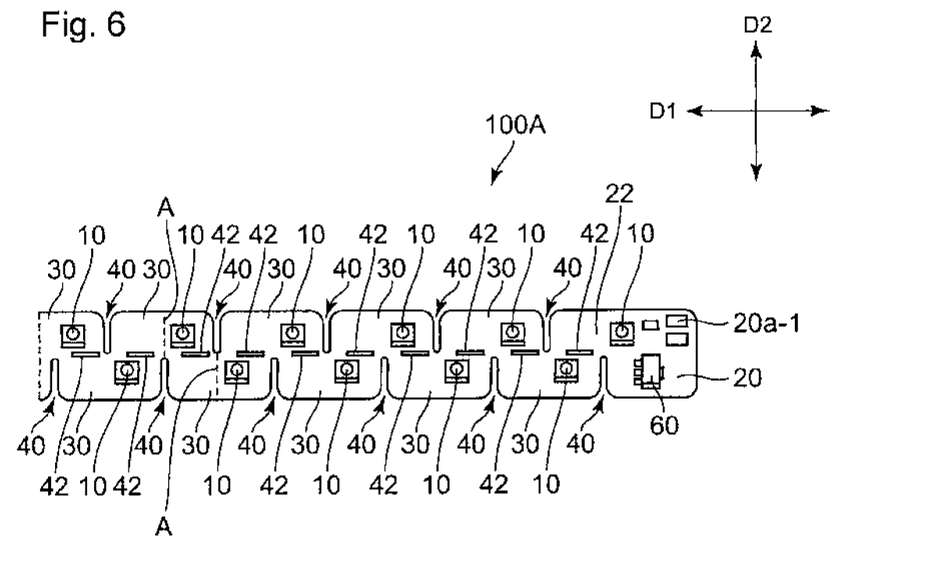
FIG. 6 is an enlarged plan view illustrating the tip part of a flexible board 20 of a light emitting device 100A, which is a variation of the light emitting device 100.
Figure 7A:
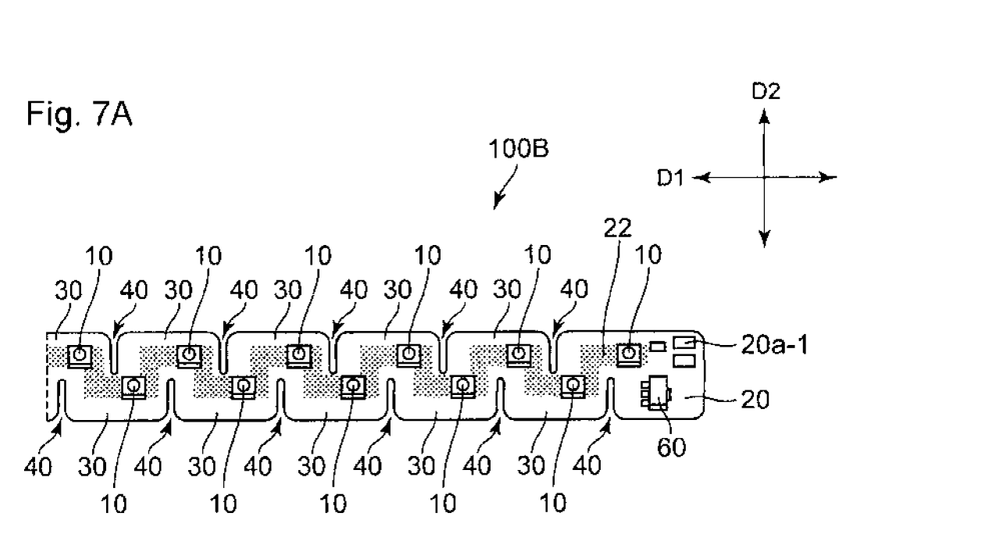
FIG. 7A is an enlarged plan view illustrating the tip part of a flexible board 20 of a light emitting device 100B, which is a variation of the light emitting device 100.
Figure 7B:
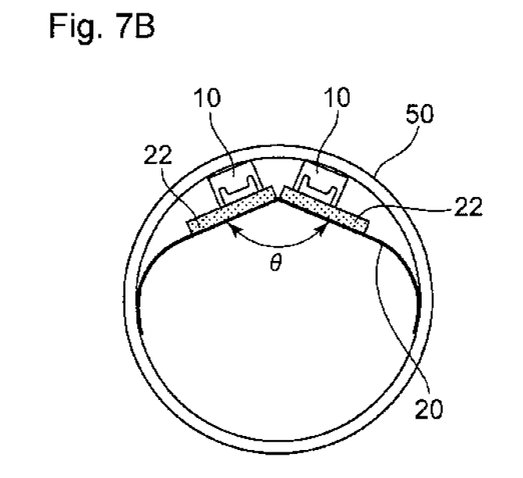
FIG. 7B is a cross sectional view of the light emitting device 100B along the transverse direction.
Figure 8:
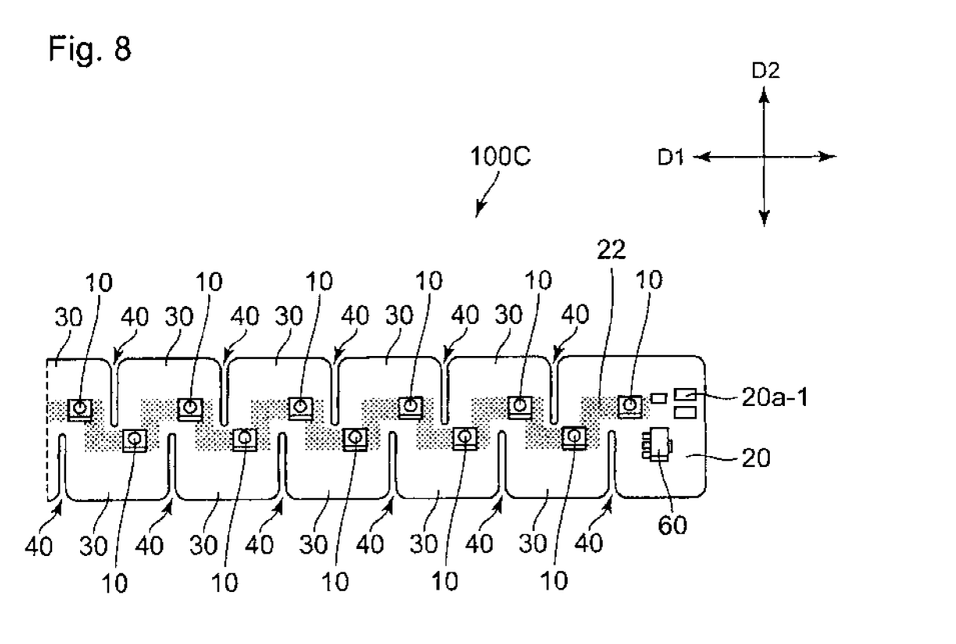
FIG. 8 is an enlarged plan view illustrating a tip part of a flexible board 20 of a light emitting device 100C, which is a variation of the light emitting device 100B.

The flexible board 20 serves as a base for mounting the light emitting elements 10 and the like, and may be provided with a wiring pattern for driving the light emitting elements 10 on the surface or the like (FIGS. 1 through 3, FIG. 5A, FIG. 5B and FIG. 6 do not depict the wiring, and FIGS. 7A, 7B and 8 depict only either p-side or n-side wiring, as mentioned in detail below). As illustrated in FIG. 2, the flexible board 20 is longer in the first direction D1 (extends in the first direction D1), and includes the plurality of protrusions 30 aligned in the first direction 10 on each side in the second direction D2 perpendicular to the first direction D1, on which the light emitting elements 10 mounted. That is, in an exemplary embodiment, as shown in FIG. 2, the flexible board 20 includes a set of a plurality of protrusions 30 that projects in one of the second direction D2 (e.g. upward in FIG. 2) from the center and another set of a plurality of protrusions 30 that projects in the other direction of the second direction D2 (e.g. downward in FIG. 2) from the center.

The set of protrusions 30 projecting from the center in one direction are aligned along the first direction D1. Similarly, the set of protrusions 30 projecting from the center in the other direction are aligned along the first direction.

Each of the protrusions 30 projecting from the center in one direction is provided with at least one light emitting element 10 mounted thereon. It is preferred that the light emitting elements 10 placed on the set of protrusions 30 projecting from the center in one direction are aligned along the first direction D1 as illustrated in FIG. 2. Similarly, each of the protrusions 30 projecting from the center in the direction is provided with at least one light emitting element 10 mounted thereon. It is preferred that that the light emitting elements 10 placed on the set of protrusions 30 projecting from the center in the other direction are aligned along the first direction D1 as illustrated in FIG. 2.

In an obtained example according to the embodiment, the flexible board 20 was made of polyimide. It is preferred that the overall width of the flexible board 20 in the second direction D2 is longer than the inner diameter of the tube 50 so that the flexible board 20 is housed in the tube 50 in a bent position. In the example, the tube 50 has a diameter of 10 mm, and the flexible board 20 has an overall width in the second direction of 14 mm. Further, in the example, the flexible board 20 has an overall length in the first direction D1 of 1000 mm.

As illustrated in FIG. 2, the plurality of protrusions 30 aligned along the first direction are apart from each other by cutouts 40. The cutouts 40 preferably extend in the second direction D2. When the tube 50 housing the flexible board 20 in a bent position is bent, this can prevent the adjacent protrusions 30 from overlapping with each other, which results in smooth bending. The cutouts 40 may be placed with a displacement in the first direction D1 between one and the other sides in the second direction D2 of the flexible board 20. That is, the plurality of cutouts 40 are staggered between one and the other sides in the second direction. This makes it easier to bend the tube 50, and also prevents the flexible board 20 from breakage caused by bending. That is, if the cutouts 40 are positioned such that they are opposed to each other between one and the other sides in the second direction D2 of the flexible board 20, the stress caused by bending is concentrated in the narrowed areas between the opposing cutouts of the flexible board, which may result in breakage of the flexible board. In contrast, with the above-mentioned configuration, the stress caused by bending the light emitting device 100 is not concentrated in any specific areas of the flexible board 20. As a result, the flexible board 20 is prevented from breakage. Furthermore, if the cutouts 40 are opposed to each other, the narrowed areas hinder heat dissipation, which results in low heat dissipation property. However, because the cutouts 40 are staggered so that such narrowed areas are eliminated, the heat dissipation property is not degraded.

It is preferred that the protrusions 30 have a shape that allows deformation when the light emitting elements 10 mounted on the protrusions 30 are pressed by the tube 50. For example, such shapes include a rectangular shape (in a plan view in the direction perpendicular to both of the first direction D1 and the second direction D2). If the protrusions 30 have a rectangular shape, the corners of the protrusions 30 (i.e. distal tips of the protrusions 30) are preferably chamfered as illustrated in FIG. 2. This makes it easier to insert the flexible board 20 into the tube 50 without any damage to the inner wall of the tube 50. Furthermore, since the corners of the adjacent protrusions 30 do not come in contact with each other when the tube 50 is bent, the tube 50 can be bent more smoothly.

The bendability of the tube 50 depends on the width of the protrusion 30 (the length in the first direction D1), the width of the cutouts 40 (the length in the first direction D1) and the depth of the cutouts 40 (the length in the second direction D2). That is, while narrower width of the protrusions 30 makes it easier to bend the light emitting device 100, it also decreases the area for a providing a constant current circuit mentioned below, which makes the circuit design difficult. On the contrary, wider width of the protrusions 30 makes it more difficult to bend the light emitting device 100. In consideration of this, the width of the protrusions 30 is preferably 8 to 16 mm, more preferably 10 to 14 mm. In the obtained example according to the embodiment, the width of the protrusions 30 was 14 mm. Further, too narrow width of the cutouts 40 (i.e. too close distance between adjacent protrusions 30) may degrade the smoothness of bending since the adjacent protrusions 30 may come in contact with each other when the light emitting device 100 is bent. On the contrary, too wide width of the cutouts 40 may degrade the heat dissipation property due to decreased areas for providing the protrusions 30. In consideration of this, the width of the cutouts 40 is preferably 1 mm to 3 mm, more preferably 1 mm to 2 mm. In the obtained example according to this embodiment, the width of the cutouts 40 was 2 mm. Further, too shallow depth of the cutouts 40 deprives the protrusions 30 of flexibility, and the protrusions 30 therefore cannot relieve the pressure on the light emitting elements 10 from the tube 50. On the contrary, while deeper cutouts 40 makes it easier to bend the tube 50 which houses the flexible board 20 in a bent position, too deep cutouts 40 makes it difficult to design the constant current circuit. In order to obtain the advantageous effects of the present invention without reducing the productivity while taking the above consideration into account, the depth of the cutouts 40 is preferably 5.7 mm to 8 mm, more preferably 6.5 mm to 7 mm when the overall width of the flexible board 20 is 14 mm in the second direction of the flexible board 20. In the obtained example according to this embodiment, the depth of the cutouts 40 was 6.5 mm.

The bottoms of the cutouts 40 have a curved surface as illustrated in FIG. 2. If the bottoms of the cutouts 40 have a sharp corner, a crack may be initiated at the corner to result in breakage of the flexible board 20 when the light emitting device 100 is bent. However, this configuration can prevent occurrence of cracks.

In general, the flexible board 20 is made very flexible so as to be bendable in any direction. However, in the embodiment, it is preferred that the flexible board 20 is relatively hard (or elastic). In the light emitting device 100, since the flexible board 20 is clamped by the inner wall of the tube 50 in a bent position as illustrated in FIG. 3, a certain level of hardness (or elasticity) is required to be clamped by the inner wall of the tube 50. The hardness of the flexible board 20 depends on the thickness thereof. In order to impart a certain level of hardness to the flexible board 20, the thickness thereof may be preferably 40 μm to 160 μm, more preferably 60 μm to 140 μm, yet more preferably 80 μm to 120 μm.

(Relationship between Light Emitting Elements 10 and Flexible Board 20)

As illustrated in FIG. 2, the light emitting elements 10 are mounted on the flat surfaces of the protrusions 30. As used herein, the phrase "the light emitting elements 10 are mounted on the protrusions 30" includes that at least a part of a light emitting element 10 is in connection with a protrusion 30 (i.e. at least a part of the light emitting element 10 is positioned on the protrusion 30). It is preferred that the whole part of a light emitting element 10 is in connection with a protrusion (i.e. the whole part of the light emitting element 10 is positioned on the protrusion 30).

It is preferred that the light emitting elements 10 on one side in the second direction D2 of the flexible board 20 are placed with a displacement in the first direction D1 (in the right or left direction in FIG. 2) from the extension lines of the cutouts 40 on the other side in the second direction D2. When the flexible board 20 is bent, cutouts 40 are narrowed to largely deform the surrounding portions. Placing the light emitting elements 10 off these portions can prevent the light emitting elements 10 from coming off.

As illustrated in FIG. 2, it is preferred that the light emitting elements 10 are placed at positions displaced in the first direction D1 from the centers of the protrusions 30 in the first direction D1. This can reduce the force acting on the light emitting elements 10 when the tube 50 is bent, comparing to the case where the light emitting elements 10 are mounted on the centers of the protrusions 30 in the first direction D1. This is because the when the light emitting elements 10 receive pressing force, protrusions 30 are deformed more easily to relive the force, if 10 the light emitting elements 10 are placed at positions displaced in the first direction from the centers of the protrusions 30 in the first direction D1 than if they are placed at the centers of the protrusions 30.

It is preferred that the light emitting elements 10 are mounted on the proximal sides (near-center sides in the second direction D2) of the protrusions 30. This is because if the light emitting elements 10 are mounted on the distal sides (near-end sides in the second direction D2) of the protrusions 30, the light emitting directions of the light emitting elements 10 largely differ between one and the other sides in the second direction D2, which tends to result in uneven brightness.

As illustrated in FIG. 2, the light emitting elements 10 are staggered in the first direction D1 between one and the other sides in the second direction D2 of the flexible board 20. In this case, a wider distance is obtained between the light emitting elements, comparing to the case where they are not staggered in the first direction D1 (i.e. the light emitting elements 10 on one side in the second direction D2 are aligned with the respective light emitting elements 10 on the other side along the second direction D2). As a result, heat generated by the light emitting elements 10 can be effectively dissipated to the areas between the light emitting elements.

As illustrated in FIG. 2, the flexible board 20 includes connection members 20a-1 to be connected to a cable 80 in the vicinity of its end in the first direction. The cable 80 and the connection members 20a-1 may be connected by solder or the like. In the embodiment, a pair of plus and minus connection members 20a-1 is provided on each end part of the flexible board 20 in the first direction. Furthermore, the flexible board 20 may be provided with the constant current circuit composed of an electronic component 60 such as transistor, and the like (in FIG. 2, reference sign 60 refers to one of the electronic components of the constant current circuit for descriptive reasons).

FIG. 4 illustrates a diagram of a circuit provided on the flexible board 20. As illustrated in FIG. 4, a pair of plus (p) and minus (n) connection members 20a-1 is provided at each end of the flexible board 20 of the light emitting device 100, and two pairs of connection members 20a-1 are further provided in proximity to each other in the center part. That is, the flexible board 20 of FIG. 4 is composed of two units each including 21 pieces of light emitting elements 10, and can be cut at a predetermined position (e.g. the "cutting line B" of FIG. 4) between two pairs of connection members 20a-1 provided in the center part. By connecting the cable 80 to the connection members 20a-1 beside the cutting line B, each divided unit can electrify its own light emitting elements 10 and the like. By cutting the flexible board 20 by unit basis to shorten the length and also cutting the tube 50 accordingly, a user can arbitrarily adjust the length of the light emitting device 100. This configuration offers high versatility of the light emitting device.

In FIG. 4, the constant current circuit is denoted by reference sign 90.

Figure 5A:
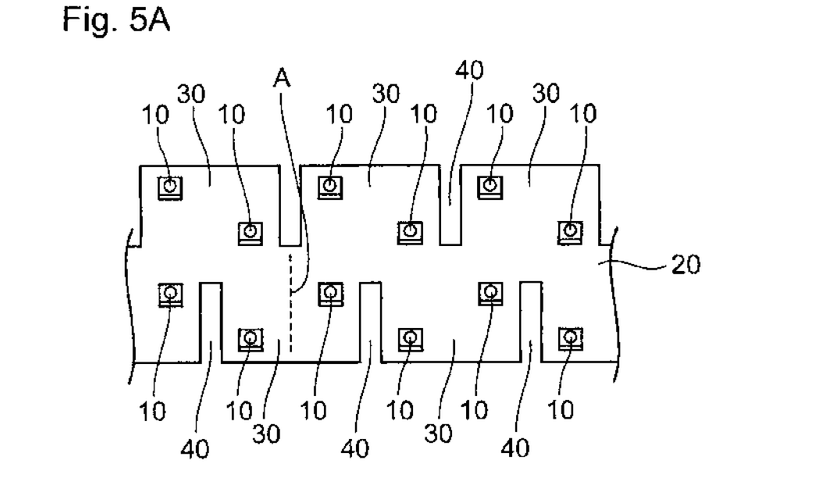
FIG. 5A is a plan view illustrating another arrangement of light emitting elements 10 of a light emitting device 100.
Figure 5B:
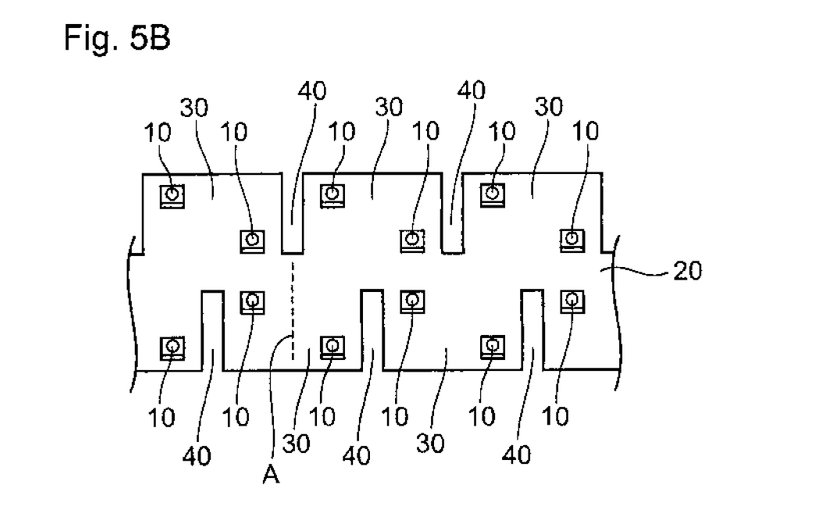
FIG. 5B is yet another arrangement of the light emitting elements 10 of the light emitting device 100.

FIG. 5A is a plan view illustrating another arrangement of the light emitting elements 10 of the light emitting device 100, and FIG. 5B is a plan view illustrating yet another arrangement of the light emitting elements 10 of the light emitting device 100.

Each of FIGS. 5A and 5B illustrates a part of the flexible board 20 of FIG. 2. Accordingly, although not shown in figures, the lateral direction and the vertical direction of FIGS. 5A and 5B respectively correspond to the first direction D1 and the second direction D2.

In the embodiment illustrated in FIG. 2, the light emitting elements 10 are arranged in two rows along the longitudinal direction (first direction D1) of the flexible board 20. Further, each protrusion 30 is provided with one light emitting element 10.

However, the present invention is not limited to this configuration, and the light emitting elements 10 may be arranged in a different number of rows besides two, and each protrusion is provided with two or more elements.

In the embodiments of FIGS. 5A and 5B, the light emitting elements 10 are arranged in four rows along the longitudinal direction (first direction D1) of the flexible board 20. Further, each protrusion 30 is provided with two light emitting elements 10.

In the embodiment of FIG. 5A, the light emitting elements 10 on the proximal row on one side in the second direction and the light emitting elements 10 on the distal row on the other side (i.e. on the second and fourth rows counting from the top in the figure) are arranged at the same positions with respect to the longitudinal direction (first direction D1). Similarly, the light emitting elements 10 on the distal row on one side in the second direction and the light emitting elements 10 on the proximal row on the other side (i.e. the first and third rows counting from the top in the figure) are arranged at the same positions with respect to the longitudinal direction (first direction D1).

In contrast, in the embodiment of FIG. 5B, the light emitting elements 10 on the two rows that are proximal in the second direction (i.e. the second and third rows counting from the top in the figure) are arranged at the same positions with respect to the longitudinal direction (first direction D1). Similarly, the light emitting elements 10 on the two rows that are distal in the second direction (i.e. the first and fourth rows counting from the top in the figure) are arranged at the same positions with respect to the longitudinal direction (first direction D1).

In the embodiments of FIGS. 5A and 5B, it is preferred that the light emitting elements 10 are not positioned on the extension lines of the cutouts 40 in the second direction D2 (e.g. the dashed line A).

(Tube 50)

The tube 50 has a hollow cylindrical (tubular) shape that is longer in the first direction D1, and is bendable. The material thereof may be flexible material such as silicone resin. The tube 50 may be made of either transparent or colored material. For example, if the light emitting device 100 is used as a neon tube, the tube 50 may be colored in the same color as the emission light of the light emitting elements 10. With this configuration, the light emitting device 100 look the same color between during daytime when the light emitting elements 10 are off and during night when the light emitting elements 10 are on. In order to prevent that the appearance has bright spots only at the mount positions of the light emitting elements 10, a light diffusing agent may be added to the tube 50.

It is preferred that the flexible board 20 is housed in the tube 50 in such a bent position that the center thereof is located at an upper position than the both ends as illustrated in FIG. 3 (i.e. the light emitting elements 10 mounted on the flexible board 20 faces away from each other). This enables wide light distribution. Here, the bending angle at the center of the flexible board 20 (angle θ in FIG. 3) may be suitably set so as to reduce uneven brightness. In the obtained example according to this embodiment, the angle θ was 120°.

The flexible board 20 is curved so as to increase the contact area between the distal areas of the protrusions 30 and the inner wall of the tube 50, and is clamped by the tube 50 by the action of the resilience of the protrusions 30. With this configuration, the flexible board 20 is easily clamped by the inner wall of the tube 50 without using an adhesive material. Further, it is preferred that the light emitting elements 10 are in contact with the inner wall of the tube 50. This increases the contact area with the tube 50, and thereby prevents the flexible board 20 from being displaced in the tube 50 when the light emitting device 100 is bent.

Meanwhile, in the light emitting device 100, the flexible board 20 is not fixed on the inner wall of the tube 50. Therefore, when the light emitting device 100 is bent (i.e. the tube 50 is bent), the flexible board 20 can slide to some extent. As a result, the flexible board 20 can be prevented from being displaced from the original orientation, even when the tube 50 is bent.

In the embodiment of FIG. 3, the light emitting elements 10 abut the inner wall of the tube 50, but the center part of the flexible board 20 (as used herein, the center part means the center part in the second direction D2 in FIG. 2) does not abut the inner wall of the tube 50.

However, the present invention is not limited thereto. For example, the light emitting elements 10 and the center part of the flexible board 20 may both abut the inner wall of the tube 50.

Further, in the light emitting device 100, the protrusions 30 of the flexible board 20 abut the inner wall of the tube 50 with the surfaces where the light emitting elements 10 are mounted as illustrated in FIG. 3. That is, the surfaces (a part of the surfaces), i.e. portions having larger area, abut the inner wall of the tube 50. As a result, the inner wall of the tube 50 can clamp the flexible board 20 more firmly.

(Caps 70, and Cables 80)

As illustrated in FIG. 1, caps 70 may be provided on each end of the tube 50. While the tube 50 is typically open at both ends, closing the ends with the caps 70 can make the tube waterproof. As a result, the light emitting device can be used outdoors. The caps 70 are penetrated by cables 80 that supply the light emitting elements 10 and electronic component 60 with electric power. The ends of the cables 80 are connected to the connection members 20a-1 provided on the flexible board 20. In the embodiment, each pair of cables corresponds to one pair of plus and minus connection members 20a-1, and penetrates one cap.

(Variation 1)

FIG. 6 is an enlarged plan view illustrating the tip part of a flexible board 20 of a light emitting device 100A, which is a variation of the light emitting device 100.

Unless otherwise noted, the components illustrated in FIG. 6 may have the same configuration with the corresponding components illustrated in FIG. 2.

In the embodiment of FIG. 6, the flexible board 20 includes slits 42 along the first direction D1 positioned at the center part in the second direction D2. This makes it easier to bend the flexible board 20, and thus makes it easier to insert it into the tube 50.

It is preferred that each slit 42 is positioned between the extension line of a cutout 40 on one side in the second direction D2 and the extension line of an adjacent cutout 40 on the other side in the second direction (e.g. between the two extension lines A in FIG. 6). This makes it easier to build the wiring on the flexible board 20 to establish conduction as well as to bend the flexible board 20.

(Variation 2)

FIG. 7A is an enlarged plan view illustrating the tip part of a flexible board 20 of a light emitting device 100B, which is another variation of the light emitting device 100. FIG. 7B is a cross sectional view of the light emitting device 100B along the transverse direction. In order to provide a better understanding of the arrangement of light emitting elements 10, FIG. 7B, in a cross sectional view, illustrates two light emitting elements 10 that are not on the same cross section in reality.

Unless otherwise noted, the components illustrated in FIG. 7A may have the same configuration with the corresponding components illustrated in FIG. 2.

In the embodiment of FIGS. 7A and 7B, the width (length in the second direction D2) of a wiring 22 formed on the flexible board 20 is as same as or wider than the size of light emitting elements 10 in the second direction D2.

This allows the whole part (or most part) of the light emitting elements 10 to be positioned on the wiring 22. The wiring 22 is made of metal film such as copper for example, and has high heat conductivity. This makes it easier to diffuse heat of the light emitting elements 10.

The wiring 22 serves as one of plus (p) wiring and minus (n) wiring. Although not shown in FIGS. 7A and 7B, the other one of plus (p) wiring and minus (n) wiring normally has narrower width than the wiring 22, and is provided on the flexible board 20.

The wiring 22 may be coated with a protective layer made of resin or the like except for the areas on which the light emitting elements 10 are mounted. The protective layer can prevent short-circuit or the like. A preferred example of the protective layer is composed of an adhesive layer to stick to the wiring layer 22, a cover layer made of a polyimide resin and a coating layer containing a white pigment or the like, in the order from the side facing the wiring 22.

(Variation 3)

FIG. 8 is an enlarged plan view illustrating the tip part of a flexible board 20 of a light emitting device 100C, which is a variation of the light emitting device 100B.

The light emitting device 100C may have the same configuration with the light emitting device 100B except that the length of the flexible board 20 in the second direction D2 (in particular the length of protrusions 30 in the second direction D2) is longer than that of the light emitting device 100B.

In the light emitting device 100C, the longer length of the protrusions 30 in the second direction D2 can create larger areas in the distal parts in the second direction D2 where the light emitting elements 10 are not mounted. The protrusions 30 can therefore be in contact with the inner wall of the tube 50 with larger areas. As a result, the inner wall of the tube 50 can clamp the flexible board 20 more firmly.

When the overall width of the flexible board 20 in the second direction D2 is 28 mm, the preferred length of the protrusions 30 in the second direction D2 is 13 mm to 14 mm.

What is claimed is:

1. A light emitting device, comprising:
   a bendable tube extending in a first direction;
   a flexible board extending in the first direction and housed in the tube; and
   a plurality of light emitting elements mounted on the flexible board,
   the flexible board comprising a plurality of protrusions aligned in the first direction on both sides in a second direction perpendicular to the first direction,
   the light emitting elements are mounted on the plurality of protrusions,
   the plurality of protrusions being in contact with an inner wall of the tube such that the inner wall clamps the flexible board in a bent position.

2. The light emitting device according to claim 1, wherein the plurality of protrusions aligned in the first direction are separated by cutouts, and
   the light emitting elements mounted on one side in the second direction of the flexible board are not on extension lines of the cutouts on the other side.

3. The light emitting device according to claim 1, wherein the light emitting elements are mounted at positions off the centers of the protrusions in the first direction.

4. The light emitting device according to claim 2, wherein the cutouts are staggered between one and the other sides in the second direction of the flexible board.

5. The light emitting device according to claim 1, wherein the light emitting elements are staggered between one and the other sides in the second direction of the flexible board.

6. The light emitting device according to claim 1, wherein the light emitting elements are in contact with the inner wall of the tube.

7. The light emitting device according to claim 2, wherein the bottoms of the cutouts have a curved surface.

8. The light emitting device according to claim 1, wherein corners of the protrusions are chamfered.

9. The light emitting device according to claim 1, wherein the tube is colored with a same color as emission light of the light emitting elements.

10. The light emitting device according to claim 1, wherein the light emitting device is configured to be functional even when the flexible board is cut at a middle part.

* * * * *